United States Patent [19]

Darrow et al.

[11] 4,314,234
[45] Feb. 2, 1982

[54] TEST SET FOR RAILWAY CAB SIGNAL SYSTEM

[75] Inventors: John O. G. Darrow, Murrysville; Joseph J. Pierro, Dayton, both of Pa.

[73] Assignee: American Standard Inc., Swissvale, Pa.

[21] Appl. No.: 103,885

[22] Filed: Dec. 17, 1979

[51] Int. Cl.³ .................. H04B 17/00; G01R 27/26; H04Q 1/20
[52] U.S. Cl. .................. 340/825.36; 455/226; 324/59; 246/169 R
[58] Field of Search .............. 340/650, 636, 652, 514, 340/151; 246/5, 169 R, 196, 34 R; 324/59 R, 57 PS, 57 Q; 455/67, 226

[56] References Cited

U.S. PATENT DOCUMENTS

| | | | |
|---|---|---|---|
| 3,942,108 | 3/1976 | Potter | 324/59 |
| 4,004,230 | 1/1977 | Campbell | 455/226 |
| 4,047,121 | 9/1977 | Campbell | 455/226 |
| 4,060,767 | 11/1977 | Lohrmann | 455/226 |
| 4,160,211 | 7/1979 | Wittrock | 455/226 |

*Primary Examiner*—Donald J. Yusko
*Attorney, Agent, or Firm*—J. B. Sotak

[57] ABSTRACT

An electronic cab signal test set employing an integrated circuit code oscillator for producing a code signal and an integrated circuit carrier oscillator for producing a carrier signal which is modulated by the code signal to produce a code carrier signal. The coded carrier signal drives a current source which injects current signals directly into a pair of series aiding pickup coils for testing the integrity of the pickup coils and for checking the sensitivity of the amplifier. An indicating circuit including a voltage sensing device, a switching circuit, and an illuminating device connected to the code carrier for evaluating the condition of the d.c. supply source and for indicating that the test set is properly functioning.

16 Claims, 1 Drawing Figure

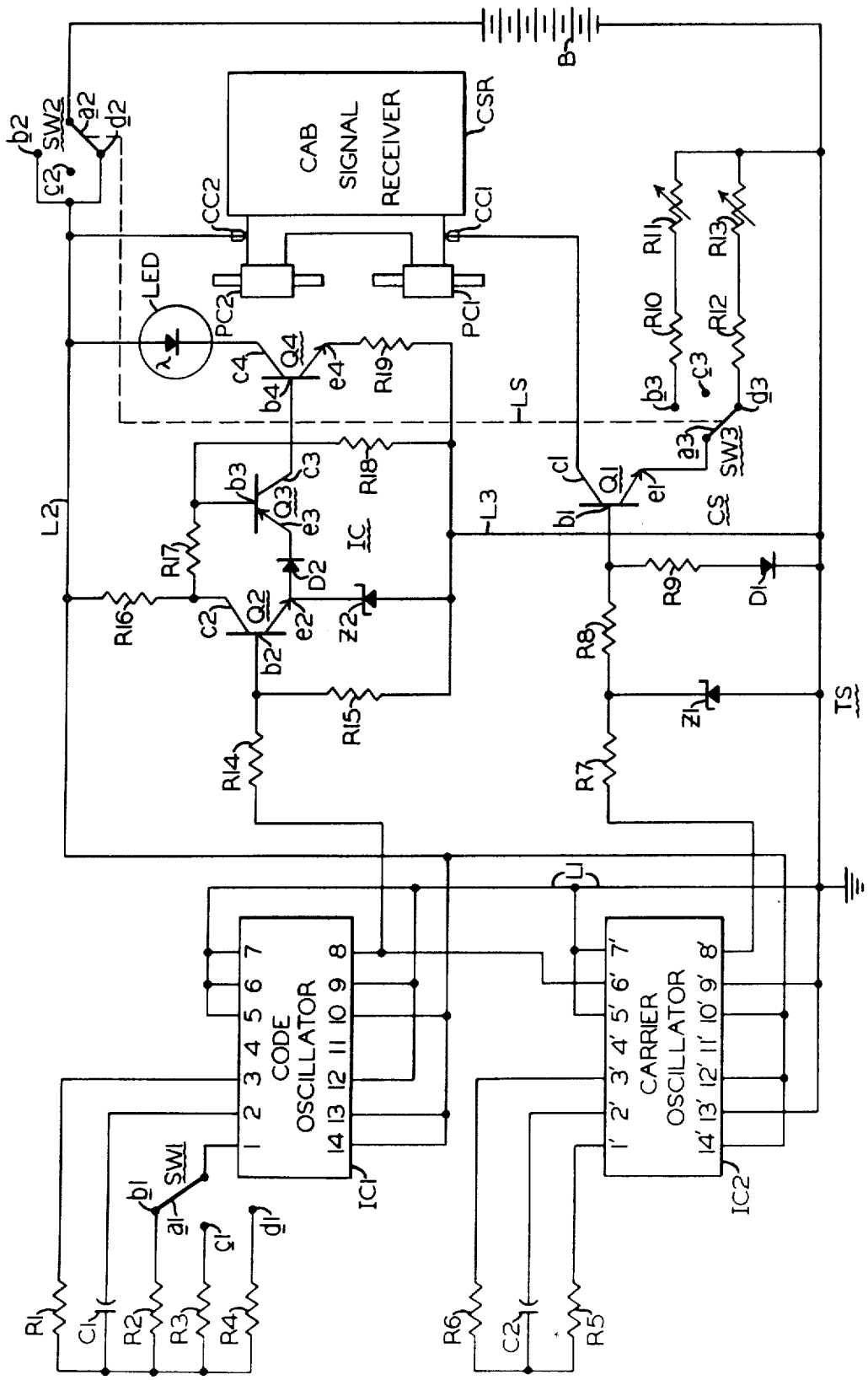

TEST SET FOR RAILWAY CAB SIGNAL SYSTEM

FIELD OF THE INVENTION

This invention relates to a signal injection test set for checking the sensitivity and integrity of a railway cab signal receiver and, more particularly, to an electronic coded carrier signal testing circuit having a code oscillator and a carrier oscillator for producing a coded carrier signal which is applied to the input of a current source having its output directly electrically connected to the pickup coils of a cab signal receiver for determining whether the pickup coils are intact and whether the amplifier is operating properly within its given prescribed range and having an indicator driven by the code oscillator for checking the test set supply voltage and circuit operation.

BACKGROUND OF THE INVENTION

Traditionally, the cab signal receivers on board of railway and mass and/or rapid transit vehicles are tested daily prior to placing a train in revenue service or regular operation. Previously, the method of testing the sensitivity and integrity of the cab signal receiver was to position the pickup coils over a suitable wire loop or track circuit so that test signals fed into the loop or track were inductively coupled to the pickup coils. Thus, in the past, it was necessary either to physically place a pair of inductive loops of a portable test set under the car-carried receiver pickup coils or to move the front end of the vehicle onto the track circuit or over a fixed test loop in a permanent installation.

In either case, it is both time consuming and expensive to initially set up an indirectly coupled cab signal test facility. In addition, previous code test sets were bulky as well as complex due to a multitude of components and circuitry. For example, each of the code rates required a separative active oscillating circuit for selectively coding the carrier signal. In one instance, an eighty foot (80') length of wire was laid between the rails of the test track to form the inductive loop to carry the simulated track current. In another case, a pair of inductive coils had to be physically and precisely positioned beneath the pickup coils of each locomotive or lead car prior to conducting the cab signal tests. It will be appreciated that the power requirement of inductive types of test sets must be equivalent to that of the wayside cab signal transmitters which are comparatively large when the induced pickup current range is between 1.3 and 1.6 amperes. A further problem encountered in inductive types of code testing was due to the large amount of iron and steel in a railway environment which causes inconsistent test results. Thus, there is a valid need for improving and simplifying the method and apparatus for more effective and efficient departure testing cab signal equipment.

OBJECTS OF THE INVENTION

Accordingly, it is an object of the invention to provide a unique cab signal receiver test set for checking the integrity of the pickup coils and for evaluating the sensitivity of the amplifier.

Another object of this invention is to provide a novel code test set for a cab signal receiver which employs directly injecting test signals into the pickup coils.

A further object of this invention is to provide a new and improved testing apparatus which is directly connected across the pickup coils for checking that the cab signal equipment is properly operating within a given range.

Still another object of this invention is to provide a signal injection test set for cab signal apparatus.

Still a further object of this invention is to provide a unique cab signal code test set for checking the condition of the inductive pickup coil and electronic amplifier.

Yet another object of this invention is to provide a test set for railway cab signal equipment comprising, a code oscillating circuit for producing carrier signals which are modulated by the code signals for producing coded carrier signals, a current source having an input and an output, the coded carrier signals fed to the input of the current source, the output of the current source connected across the pickup coils of the cab signal receiver for verifying the integrity of the pair of pickup coils and for checking the sensitivity of an amplifier of the cab signal receiver.

Yet a further object of this invention is to provide apparatus for testing the integrity of pickup coils and the response of an amplifier of a cab signal receiver comprising, means for generating code and modulating signals, means for modulating the code and carrier signals to produce coded carrier signals, means for amplifying the coded carrier signals and means for injecting the amplified coded carrier signals in the form of a current source directly into the pickup coils without changing their tuning characteristics.

An additional object of this invention is to provide an electronic coded cab signal receiver test set which is economical in cost, unique in design, efficient in operation, dependable in service, durable in use, and simple in construction.

SUMMARY OF THE INVENTION

In accordance with the present invention, there is provided a solid-state or electronic cab signal receiver test set for checking the integrity of a pair of inductive pickup coils and for testing the sensitivity of the amplifier. The test set includes an R-C integrated circuit code oscillator for generating a selected one of a plurality of code signals. An R-C integrated circuit carrier oscillator generates a carrier signal which is modulated by the selected one of the plurality of code signals to produce a coded carrier signal. The coded carrier signal is fed to the input of a transistorized current source which has its output directly connected to the pair of inductive coils and the amplifier. A selective one of a pair of impedance networks establishes upper and lower current values for evaluating whether the cab signal receiver is functioning within its given operating range. An indicating circuit includes a voltage level sensing diode and a plurality of switching transistors for coruscating a light emitting diode in accordance with the frequency of the selected one of the plurality of code signals.

DESCRIPTION OF THE DRAWINGS

The above objects and other attendant features and advantages of the present invention will become more readily apparent from the following detailed description when considered and reviewed in conjunction with the accompanying drawing, wherein:

The single FIGURE is a schematic circuit diagram of a preferred embodiment of an electronic coded cab signal receiver test set arrangement of the present invention.

Referring now to the single FIGURE, there is shown a solid-state testing apparatus generally characterized by symbol TS for checking the integrity of a pair of inductive pickup coils PC1 and PC2 and for evaluating the sensitivity of an amplifier of a cab signal receiver CSR which is carried on board a locomotive or control car. As previously mentioned, a daily departure test is performed on the railroad locomotives and lead transit cars prior to being placed in revenue service. The presently described electronic test set TS permits a single maintainer to more quickly and easily test the cab signal receiver on board the vehicle without positioning or locating the pickup coils over a test track or above a pair of inductive signal loops.

As shown, the electronic test set TS includes a code oscillator IC1, a carrier oscillator IC2, a current source CS, and an indicating circuit IC. The code oscillating circuit IC1 includes an integrated circuit programmable timer, such as, a low-power complementary MOS MC14541B, manufactured and sold by Motorola, Inc. The integrated circuit oscillator IC1 employs an external capacitor C1 and a plurality of resistors R1, R2, R3, and R4. It will be noted that one end of resistor R1 is connected to terminal 3 of oscillator IC1 while one plate of capacitor C1 is connected to terminal 2 of oscillator IC1. Terminal 1 of oscillator IC1 is connected to the movable contact a1 of three-position switch SW1. The movable switch includes three stationary contacts b1, c1, and d1 which are connected to one end of the resistors R2, R3, and R4, respectively. The other ends of resistors R1, R2, R3, and R4 and the other plate of capacitor C1 are connected in common. The terminals 5, 6, 7, 9, and 12 of integrated circuit oscillator IC1 are connected to ground via lead L1. The terminal 8 supplies code signals to the carrier oscillator IC2 and to the indicating circuit IC, as will be described hereinafter. The terminals 10, 13, and 14 are connected to the positive supply lead L2 which is selectively coupled to a voltage power source, such as, a suitable storage battery B, via a three-position switch SW2 having movable contact a2 and stationary contacts b2, c2, and d2. It will be appreciated that the frequency of oscillation of the code oscillator is determined by RC time constants of the resistive and capacitive values of R2-C1, R3-C1, or R4-C1. In practice, a code rate or frequency of 75 cpm is developed on output terminal 8 when the movable contact a1 is switched to engage stationary contact b1, as shown. A code frequency of 120 cpm and 180 cpm is developed on output terminal 8 when movable contact a1 is switched to contacts c1 and d1, respectively.

It will be observed that the carrier signal oscillator IC2 also includes an integrated circuit programmable timer, such as, an MC14541B CMOS. As shown, the terminals 1', 2', and 3' are connected to the respective ends of the resistor R5, capacitor C2, and resistor R6, respectively. The other ends of resistors R5 and R6 and capacitor C2 are connected in common. In practice, the carrier frequency which may be 100 hertz is determined by the RC time constant of resistor R5 and capacitor C2. The terminals 5', 7', 9', and 13' of oscillator IC2 are connected to ground while the terminals 10', 12', and 14' are connected to the positive voltage supply lead L2. As previously mentioned, the code signals developed on output terminal 8 of oscillator IC1 are applied to the reset terminal 6' of carrier signal oscillator IC2 which results in coded carrier signals to be produced on output terminal 8'. In practice, the mark portion of the square-wave code signals resets oscillator IC2 so that carrier signals are absent from terminal 8' while the space portion of the code signals results in the production of coded carrier signals on output terminal 8'. That is, the carrier oscillator is switched on and off by the code signal on terminal 6' to produce a coded carrier signal on output terminal 8'.

The modulated carrier signals are applied to the input of the current source CS which includes an NPN transistor Q1 having a base electrode b1, a collector electrode c1, and an emitter electrode e1. A current limiting resistor R7 has one end connected to terminal 8' while the other end is connected to the cathode of voltage regulating zener diode Z1. The anode of zener diode Z1 is connected to ground. The regulated coded carrier signals are fed to a voltage divider including resistors R8 and R9 and diode D1. The one end of resistor R8 is connected to the anode of zener diode Z1 while the other end of resistor R8 is connected to the upper end of resistor R9. The lower end of resistor R9 is connected to the anode of diode D1 while the cathode of diode D1 is connected to ground. The base electrode b1 is connected to the junction point formed between the voltage dividing resistors R8 and R9. In practice, the coded carrier signals fed to the base electrode b1 have a value of 2 volts peak-to-peak. It will be seen that the emitter electrode e1 of amplifying transistor Q1 is connected to a movable contact a3 of switch SW3. It will be noted that movable contact a3 is ganged or mechanically coupled to movable contact a2 of switch SW2 by linkage or connecting shaft LS. The switch SW3 includes three stationary contacts a3, b3, and c3. As shown, the stationary contact b3 is connected to the series connected resistors R10 and R11. The one end of resistor R10 is connected to the contact b3 while the other end of resistor R10 is connected to one end of variable resistor or potentiometer R11. The other end of variable resistor R11 is connected to ground. The stationary contact c3 is an off position or open connection. The stationary contact d3 is also connected to series connected resistors R12 and R13. The one end of resistor R12 is connected to contact d3 while the other end of resistor R12 is connected to variable resistor or potentiometer R13. The other end of variable resistor R13 is connected to ground. The resistive value of the series connected resistors R10 and R11 is approximately 17 k ohms while the resistive value of resistors R12 and R13 is approximately 20 k ohms. As shown, the collector electrode c1 which exhibits a very high impedance is directly connected to the lower end of the pickup coil PC1 via clip connector CC1 or the like. It will be noted that the upper end of pickup coil PC2 is directly connected via clip connector CC2 to stationary contacts b2 and d2 of switch SW2 which includes an open contact or off position c2. The movable contact a2 of switch SW2 is connected to the positive terminal of the power supply battery B while the negative terminal of battery B is connected to ground.

As previously mentioned, the coded signals are fed to the input of the indication circuit IC. As shown, the indication circuit includes a plurality of switching transistors Q1, Q2, and Q3 for turning on and off or coruscating a light emitting diode LED. The input switching NPN transistor Q1 includes a base electrode b2, a collector electrode c2, and an emitter electrode e2. It will be noted that one end of resistor R14 is connected to output terminal 8 of the code oscillator IC1 while the other end of resistor R14 is connected to the base electrode b2. The base electrode b2 is also connected to the upper end of resistor R15 which has its lower end connected to ground via lead L3. The collector electrode c2 is connected to the positive supply lead L2 via resistor R16. The emitter electrode e2 is connected to the anode of a voltage level sensing zener diode Z2 while the anode of zener diode Z2 is connected to ground. The emitter electrode e2 is also connected to the emitter electrode e3 of the intermediate switching PNP transistor Q3 via diode D2. The base electrode b3 is connected to the junction point form between resistors R17 and R18. As shown, the left end of resistor R17 is connected to collector electrode c2 while the lower end of resistor R18 is connected to ground. The resistors R16, R17, and R18 form a voltage divider network for supplying biasing and operating potentials for the switching circuit. The collector electrode c3 is directly connected to the base electrode b4 of the output switching NPN transistor Q4. The emitter electrode e4 is connected to ground via resistor R19. The collector electrode c4 which looks like a current source is connected to the cathode of light emitting diode LED while its anode electrode is connected to positive supply voltage lead L2.

In describing the operation of the test set TS, it will be initially assumed that the ganged switches SW2 and SW3 are moved to their intermediate neutral or off positions wherein the movable contacts a2 and a3 engage stationary contacts c2 and c3. Under this assumed condition, the necessary biasing and operating voltages are not available for the code oscillator IC1, carrier oscillator IC2, current source CS, and indicating circuit IC so the test set TS may be safely connected across or disconnected from the series aiding inductive pickup coils PC1 and PC2.

Let us now assume that the clip connectors CC1 and CC2 are connected across the pickup coils PC1 and PC2 and that the ganged switches SW2 and SW3 are moved to the positions wherein movable contacts a2 and a3 engage the stationary contacts d2 and d3, respectively, as shown. Under this condition, the various circuits are supplied with working voltages from battery B over closed contacts a2 and d2. Further, let us assume that the switch SW1 is the position shown in the drawing wherein movable contact a1 engages stationary contact b1 so that the code signal oscillator generates an output signal having a 75 cpm code rate on terminal 8. Thus, the code pulses on input reset terminal 6' causes the modulation of the 100 Hz carrier signals so that coded carrier signals are developed on output terminal 8' of carrier oscillator IC2. After being regulated by zener diode Z1, the coded carrier signals are voltage divided by resistors R8 and R9 so that signals having a peak-to-peak value of 2 volts are applied to the input of transistor Q1. With the switch contacts a3 and d3 being closed, the impedance of resistors R12 and R13 causes an output current, approximately equal to that which would be produced by rail current of 1 ampere, to flow through the collector-emitter junction of transistor Q1. Thus, the current signal which flows through the two series aiding pickup coils PC1 and PC2 is equivalent to 1 ampere of actual rail current. The simulated ampere of rail current is below the lower limit, namely, the 1.3 ampere of the operating range of the cab signal receiver. Ergo, the voltage developed across the series aiding pickup coils is less than 6 volts peak-to-peak which is insufficient to cause the amplifier to produce amplified signals which are detectable so that none of the speed signal aspect lights in the vehicle cab light up. However, the maintainer is assured of the proper operation of the test set by the flickering or flashing of the light emitter diode LED. The code pulses appearing on output terminal 8 of code oscillator IC1 are applied to the base electrode b2 of input switching transistor Q2 which is turned on and off in accordance with the code frequency. When the code signal is high or positive and is larger than the zener voltage of diode Z2, the transistor Q2 is turned on which, in turn, causes the transistor Q3 to turn on and to apply a voltage essentially equal to the zener voltage of diode Z2 to base b4. The conduction of transistor Q3 causes the transistor Q4 to also turn on and results in a collector current determined by the voltage of diode Z2 and the resistance of resistor R19. Therefore, the conduction of transistor Q4 causes the illumination of the light emitting diode LED with a current independent of battery voltage. Now, when the code signal switches to its low value, the transistors Q2, Q3, and Q4 are all turned off so that the light emitting diode LED is also turned off. Thus, the light emitting diode LED is repeatedly turned on and off with a constant current at the code rate, in this instance 75 cpm, to signify that the test set TS is properly functioning and that the battery B is in good shape. Now, if the voltage of battery B falls below a given value and causes the voltage level at the base electrode b2 to fall below the avalanche voltage of zener diode Z2, the indicating circuit IC is rendered inactive so that a maintainer is apprised of the fact that the battery must be recharged or replaced. Thus, the zener diode Z2 serves as a reference for measuring the battery voltage and also for determining the amount of current which drives light emitting diode LED.

Let us assume that the battery is in good condition so that the maintainer may resume testing the integrity of the pickup coils and checking the sensitivity of the amplifier. Next, the maintainer moves the switches SW2 and SW3 so that movable contacts a2 and a3 now engage stationary contacts b2 and b3. Under this condition, operating power is supplied by battery B over contacts a2 and b2 and the resistors R10 and R11 are connected to the emitter electrode e1 via contacts a3 and b3. The impedance value of resistors R10 and R11 causes a current signal, which is approximately equal to that caused by 2 amperes of actual rail current, to flow through the pickup coils from the current source CS, the voltage developed across the series aiding pickup coils is sufficient to drive the amplifier which has a pickup sensitivity range approximately equivalent to 1.3 to 1.6 amperes of actual rail current. The amplified coded carrier signals are detected and decoded to cause the red cab signal aspect light to become illuminated to signify a speed of under 30 mph. The maintainer may observe the coruscating of the light emitting diode LED to ascertain the proper operation of the test set TS and the charged condition of battery B. Next, the maintainer may check the 120 and 180 cpm code rates by moving the switch SW1 to cause the movable contact a1 to engage contacts c1 and then d1, and then sequentially moving the switches SW2 and SW3 to close contacts a2-b2 and a3-b3. In each case, if the simulated low current value is less than 1.3 amperes, the cab signal aspects will not be illuminated, and if the simulated high current value is above 1.6 amperes, the appropriate cab signal aspects, namely, the yellow light (120 cpm code rate) or the green light (180 cpm code rate) will be illuminated. Thus, the subject test set simply injects current into the cab signal receiver to test the integrity of the pickup coils and to check the sensitivity of the amplifier without the need of external ancillary equipment, such as, inductive loops or track circuits. It will be appreciated that the use of a current source does not upset the quality Q of the tuned pickup coils of the cab signal receiver due to the high impedance which isolates the test set from the cab signal receiver, so that the tuning as well as the integrity of the pickup coils is checked which would not be plausible if one attempted to utilize a simple voltage source.

It will be understood that various alterations and changes may be made by those skilled in the art without departing from the spirit and scope of the present invention. For example, the tuning circuits R2-C1, R3-C1, or R4-C1 may be changed to accommodate other code frequencies, and the number of contacts and tuned circuits may be increased or decreased dependent upon the specific needs of the particular cab signal system. In addition, it is understood that the tuned circuit R5-C2 may be changed to accommodate other carrier frequencies, and a multiple position switch may be used to interconnect a selected one of a plurality of tuned carrier circuits. Further, it is understood that the impedance values of the series connected resistances R10-R11 and R12-R13 may be changed to handle other preselected minimum pickup ranges of rail current, such as, 0.25–0.30 amperes, 0.45–0.55 amperes, etc. Moreover, it is apparent that other modifications and ramifications may be made to the presently described invention and, therefore, it is understood that all changes, alterations, or equivalents falling within the spirit and scope of the subject invention are herein meant to be in the appended claims.

Having now described the invention, what we claim as new and desire to secure by Letters Patent, is:

1. A test set for railway cab signal equipment comprising, a code oscillating circuit for producing code signals, a carrier oscillating circuit for producing carrier signals which are modulated by the code signals for producing coded carrier signals, a current source having an input and an output, the coded carrier signals fed to the input of said current source, the output of said current source connected across a pair of pickup coils of the cab signal receiver for verifying the integrity of the pair of pickup coils and for checking the sensitivity of an amplifier of the cab signal receiver.

2. The test set for railway cab signal equipment as defined in claim 1, wherein said code oscillating circuit includes an integrated circuit oscillator.

3. The test set for railway cab signal equipment as defined in claim 1, wherein said carrier oscillating circuit includes an integrated circuit oscillator.

4. The test set for railway cab signal equipment as defined in claim 1, wherein said code oscillating circuit includes an R-C oscillator having selective resistance means for varying the frequency of oscillation.

5. The test set for a railway cab signal receiver as defined in claim 1, wherein said carrier oscillating circuit includes an R-C oscillator.

6. The test set for a railway cab signal receiver as defined in claim 4, wherein said selective resistance means includes a plurality of switch controlled resistors.

7. The test set for a railway cab signal receiver as defined in claim 1, wherein said current source includes a transistor amplifier having a high output impedance.

8. The test set for a railway cab signal receiver as defined in claim 1, wherein said current source includes an amplifier having one of a pair of selective resistive networks connectable to the output of said amplifier.

9. The test set for a railway cab signal receiver as defined in claim 1, wherein one of said pair of selective resistive networks establishes a lower current level and the other of said pair of selective resistive networks establishes an upper current level.

10. The test set for a railway cab signal receiver as defined in claim 1, wherein an indicator circuit includes a light source which is coruscated in accordance with the frequency of said code oscillating circuit.

11. The test set for a railway cab signal receiver as defined in claim 10, wherein said indicator circuit includes a battery level detector which prevents the coruscation of the light source when the battery voltage falls below a given value.

12. The test set for a railway cab signal receiver as defined in claim 10, wherein said light source is a light emitting diode which is driven by a constant current source.

13. The test set for a railway cab signal receiver as defined in claim 10, wherein said indicator circuit includes a plurality of transistor stages for switching a light emitting diode on and off in response to the code oscillating circuit.

14. The test set for a railway cab signal receiver as defined in claim 1, wherein said code oscillating circuit includes a plurality of switchable resistors for selectively establishing a given code rate.

15. The test receiver for a railway cab signal receiver as defined in claim 1, wherein a pair of electrical leads are directly connected from the output of said current source to said pair of pickup coils.

16. Apparatus for testing the electrical condition of pickup coils and the response of an amplifier of a cab signal receiver comprising,
   (a) means for generating code and carrier signals,
   (b) means for modulating said code and carrier signals to produce a coded carrier signal,
   (c) means for amplifying said coded carrier signal at one of at least two different preselected values, and
   (d) means for injecting said amplified coded carrier signal as a current directly into the pickup coils to verify the integrity of the pickup coils and to check the sensitivity of the amplifier of the cab signal receiver.

* * * * *